US012671317B2

(12) United States Patent     (10) Patent No.:   US 12,671,317 B2

Liu                               (45) Date of Patent:      Jun. 30, 2026

(54) VOLTAGE CONVERSION CIRCUIT AND VOLTAGE CONVERSION CHIP

(71) Applicant: TCL CHINA STAR OPTOELECTRONICS TECHNOLOGY CO., LTD., Shenzhen (CN)

(72) Inventor: Jinfeng Liu, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 444 days.

(21) Appl. No.: 17/417,923

(22) PCT Filed: May 28, 2021

(86) PCT No.: PCT/CN2021/096663

§ 371 (c)(1),
(2) Date: Jun. 12, 2024

(87) PCT Pub. No.: WO2022/160533

PCT Pub. Date: Aug. 4, 2022

(65) Prior Publication Data

US 2025/0125715 A1     Apr. 17, 2025

(30) Foreign Application Priority Data

Jan. 26, 2021    (CN) .......................... 202110101706.7

(51) Int. Cl.
*H02M 1/32*       (2007.01)
*H02H 7/10*       (2006.01)
(Continued)

(52) U.S. Cl.
CPC ................ *H02M 1/32* (2013.01); *H02H 7/10* (2013.01); *H02M 3/10* (2013.01); *H03K 17/74* (2013.01)

(58) Field of Classification Search
CPC .......... H02M 1/32; H02M 3/10; H03K 17/74; H02H 7/10
See application file for complete search history.

(56) References Cited

U.S. PATENT DOCUMENTS 5,929,665 A  *   7/1999   Ichikawa ................ H02M 1/08
                                          327/109
8,354,799 B2 *   1/2013   Yang ...................... H05B 45/54
                                         315/185 S (Continued)

FOREIGN PATENT DOCUMENTS

CN        201965891 U      9/2011
CN        105024547 A     11/2015
(Continued)

*Primary Examiner* — Yusef A Ahmed

(74) *Attorney, Agent, or Firm* — The Roy Gross Law Firm, LLC; Roy D. Gross

(57) ABSTRACT

The present disclosure provides a voltage conversion circuit and a voltage conversion chip. A problem that an overcurrent protection signal is falsely triggered can be solved by connecting a first diode in series between an output terminal and an input terminal of a voltage conversion module. The present disclosure provides the voltage conversion chip. A negative voltage capability of an output pin of the voltage conversion chip is increased by setting a comparator and a constant voltage source.

5 Claims, 3 Drawing Sheets

(51) Int. Cl.
     *H02M 3/10*      (2006.01)
     *H03K 17/74*     (2006.01)

(56)              References Cited

U.S. PATENT DOCUMENTS

| | | | |
|---|---|---|---|
| 9,679,880 B2 * | 6/2017 | Ikeda ............... | H03K 17/08128 |
| 9,762,116 B2 * | 9/2017 | Yamaguchi ........... | H02M 3/156 |
| 10,720,914 B1 * | 7/2020 | Koyama .......... | H03K 17/04123 |
| 10,771,057 B1 * | 9/2020 | Yoshioka .............. | H02M 7/003 |
| 2003/0067339 A1 * | 4/2003 | Yamamoto ....... | H03K 17/08142 |
| | | | 327/309 |
| 2007/0197168 A1 | 8/2007 | Amanuma et al. | |
| 2009/0213631 A1 * | 8/2009 | Inoue ..................... | H02M 1/36 |
| | | | 363/127 |
| 2012/0249020 A1 * | 10/2012 | Komatsu ................ | H02M 1/32 |
| | | | 327/109 |
| 2014/0027785 A1 * | 1/2014 | Rose ............... | H03K 17/08122 |
| | | | 257/77 |
| 2014/0284662 A1 * | 9/2014 | Ikeda .............. | H03K 17/08148 |
| | | | 257/195 |
| 2014/0313625 A1 * | 10/2014 | Zhou ..................... | H02H 7/122 |
| | | | 361/86 |
| 2016/0005725 A1 * | 1/2016 | Ikeda .............. | H03K 17/08128 |
| | | | 257/76 |
| 2018/0013415 A1 * | 1/2018 | Ikeda ..................... | H02M 1/08 |
| 2018/0287500 A1 * | 10/2018 | Tsutsui ............... | H02M 3/1584 |
| 2021/0242864 A1 * | 8/2021 | Okada .................. | H02M 3/156 |
| 2022/0416681 A1 * | 12/2022 | Telefus ................ | H05B 45/10 |

FOREIGN PATENT DOCUMENTS

| | | | |
|---|---|---|---|
| CN | 107393491 A | 11/2017 | |
| CN | 109239449 A | 1/2019 | |

* cited by examiner

VOLTAGE CONVERSION CIRCUIT AND VOLTAGE CONVERSION CHIP

BACKGROUND

Field of Invention

The present disclosure relates to the field of display technology, and more particularly, to a voltage conversion circuit and a voltage conversion chip.

Background of Invention

Since a turn-on voltage or a turn-off voltage (usually the turn-on voltage is 28V, and the turn-off voltage is –10V) of a thin-film transistor (TFT) in liquid crystal display (LCD) products is much higher than a power voltage (3.3V or 0V), a voltage conversion chip (level shift IC) is configured to convert the power voltage to a higher or lower analog voltage.

Generally, the voltage conversion chip with an FLT pin has a main function to change a voltage of the FLT pin from 0V to 5V after detecting that the voltage conversion chip triggers an over current protection (OCP) function, and notifies a front-end power chip to shut down a voltage output, thereby protecting an entire circuit. However, in practical applications, it is found that when power is turned on and a voltage at an output pin of the voltage conversion chip is less than a voltage at an output pin of a power chip, the OCP is not triggered, but the FLT pin will be triggered by mistake to be at a high level.

SUMMARY OF INVENTION

Technical Problem

As shown in FIG. 1, the voltage conversion chip is an internal equivalent circuit. P-type substrate (Psub) is a silicon wafer doped with trivalent boron, aluminum, gallium, and other atoms. Nwell is a N-well region of the P-type substrate, and Nwell1-Psub-Nwell2 constitute a parasitic NPN triode. When the Nwell2 is pulled low, and is lower than Psub, a parasitic diode D turns on a voltage drop, a parasitic transistor T1 can be triggered to be turned on, and a Nwell1 potential will be pulled down, causing a logic circuit of a memory (OTP) to work abnormally. Similarly, a turning on of the parasitic diode D will also trigger a turning on of a parasitic transistor T2, pulling down a potential of Nwell3, and causing the logic circuit of the OCP to work abnormally.

Solution to Technical Problem

Technical Solutions

The present disclosure provides a voltage conversion circuit, which can solve a problem of false triggering of an overcurrent protection signal by connecting a first diode in series between the output end and the input end of the voltage conversion module.

In order to achieve the above purpose, the present disclosure provides a voltage conversion circuit, including: a power module, configured to output a first voltage signal; a voltage conversion module, wherein an input terminal of the voltage conversion module is connected to the power module to receive the first voltage signal, and is configured to amplify and reduce the first voltage signal to output a second a voltage signal; and a first diode, wherein a negative electrode of the first diode is connected to an output terminal of the voltage conversion module, and a positive electrode of the first diode is connected to the input terminal of the voltage conversion module. The voltage conversion module includes: a first switching tube, wherein a first terminal of the first switching tube is connected to the output terminal of the voltage conversion module; an overcurrent protection unit, wherein the overcurrent protection unit is connected to a second terminal of the first switching tube, and the overcurrent protection unit is configured to trigger an overcurrent protection signal and send the overcurrent protection signal to the power module to make the power module stop outputting the first voltage signal; and a second diode, wherein a negative electrode of the second diode is connected to the output terminal of the voltage conversion module and the first terminal of the first switching tube, and a positive electrode of the second diode is connected to an input terminal of the power module.

Further, the first diode is a Schottky diode.

Further, the first switching tube is a parasitic NPN tube.

Further, the first voltage signal includes a high voltage signal or a low voltage signal.

Further, the voltage conversion module further includes: a second switching tube, wherein a first terminal of the second switching tube is connected to the output terminal of the voltage conversion module, the first terminal of the first switching tube, and the negative electrode of the second diode; and a storage unit, wherein the storage unit is connected to a second terminal of the second switching tube.

Further, the second switching tube is a parasitic NPN tube.

The present disclosure further provides a voltage conversion chip, wherein the voltage conversion chip includes: a multi-function configuration pin, the multi-function configuration pin includes a first input pin and a first output pin; a first power tube, wherein a first terminal of the first power tube is connected to the first output pin, and a second terminal of the first power tube is connected to the first input pin; and a comparator, wherein a positive phase input terminal of the comparator is connected to a first terminal of a constant voltage, a negative phase input terminal of the comparator is connected to the first terminal of the first power tube and the first output pin, and an output terminal of the comparator is connected to a third terminal of the first power tube. A second terminal of the constant voltage is connected to the second terminal of the first power tube and the first input pin.

Further, the voltage conversion chip further includes: a second power tube, wherein a first terminal of the second power tube is connected to the first output pin, and a second terminal of the second power tube is connected to the second input pin of the voltage conversion chip.

Further, the voltage conversion chip further includes: a first switching tube, wherein a first terminal of the first switching tube is connected to the first input pin and the first output pin; an overcurrent protection unit, wherein the overcurrent protection unit is connected to a second terminal of the first switching tube, and the overcurrent protection unit is configured to trigger an overcurrent protection signal and send the overcurrent protection signal to a power module to make the power module stop outputting a first voltage signal; and a first diode, wherein a negative electrode of the first diode is connected to the first output pin, and a positive electrode of the first diode is connected to the first input pin; a second diode, wherein a negative electrode of the second diode is connected to an output terminal of the voltage conversion module and the first terminal of the first switching tube, and a positive electrode of the second diode is connected to an input terminal of the power module.

Further, the voltage conversion chip further includes: a second switching tube, wherein a first terminal of the second switching tube is connected to the first input pin and the first output pin; and a storage unit, wherein the storage unit is connected to a second terminal of the second switching tube.

Advantages of Invention

Beneficial Effect

The present disclosure provides the voltage conversion circuit and the voltage conversion chip. The first diode is connected in series between the output end and the input end of the voltage conversion module. the voltage VDCHG at the output terminal of the voltage conversion module 110 is greater than or equal to the voltage at the input terminal of the voltage conversion module 110, and the first diode D1 is not turned on. When the voltage VDCHG at the output terminal of the voltage conversion module 110 is less than the voltage at the input terminal of the voltage conversion module 110, the first diode D1 is turned on to make the VDCHG greater than or equal to (VGL–V1), so it can ensure that VDCHG is greater than or equal to (VGL–0.3V), and it can solve the problem that the overcurrent protection signal is triggered by mistake.

The present disclosure provides the voltage conversion chip. When an output current i1 of the first output pin DHCG is large, and a voltage VDCHG of a first output pin DHCG is less than the voltage VGL of the first input pin VGL +100 mv, a comparator COMP outputs a high voltage, a first power tube Q3 is turned on, and a negative voltage of the voltage VDCHG of the first output pin DHCG is determined by the output current i1 and an on-resistance RDSON of the first power tube Q3. If the on-resistance RDSON of the first power tube Q3 is 3Ω, the chip ensures that the output current i1 with the VDCHG greater than or equal to (VGL–0.3V) is 133 mA at the maximum, thus increasing a negative voltage ability of the first output pin DHCG.

BRIEF DESCRIPTION OF DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without doing any creative work, other drawings can be obtained based on these drawings.

DETAILED DESCRIPTION OF EMBODIMENTS

Technical solutions in the embodiments of the present disclosure will be clearly and completely described below in conjunction with the accompanying drawings in the embodiments of the present disclosure. Obviously, the described embodiments are only a part of the embodiments of the present disclosure, rather than all the embodiments. Based on the embodiments of the present disclosure, all other embodiments obtained by those skilled in the art without creative work fall within the protection scope of the present disclosure. In addition, it should be understood that the specific embodiments described herein are only configured to illustrate and explain the present disclosure, and are not configured to limit the present disclosure.

Figure 1:
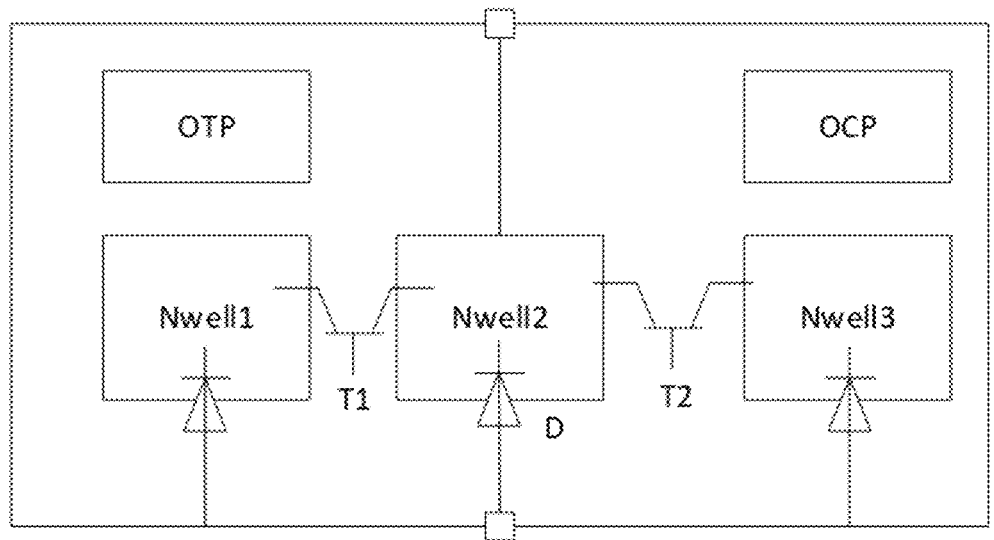
FIG. 1 is an equivalent circuit diagram of a voltage conversion chip provided by a background art.
Figure 2:
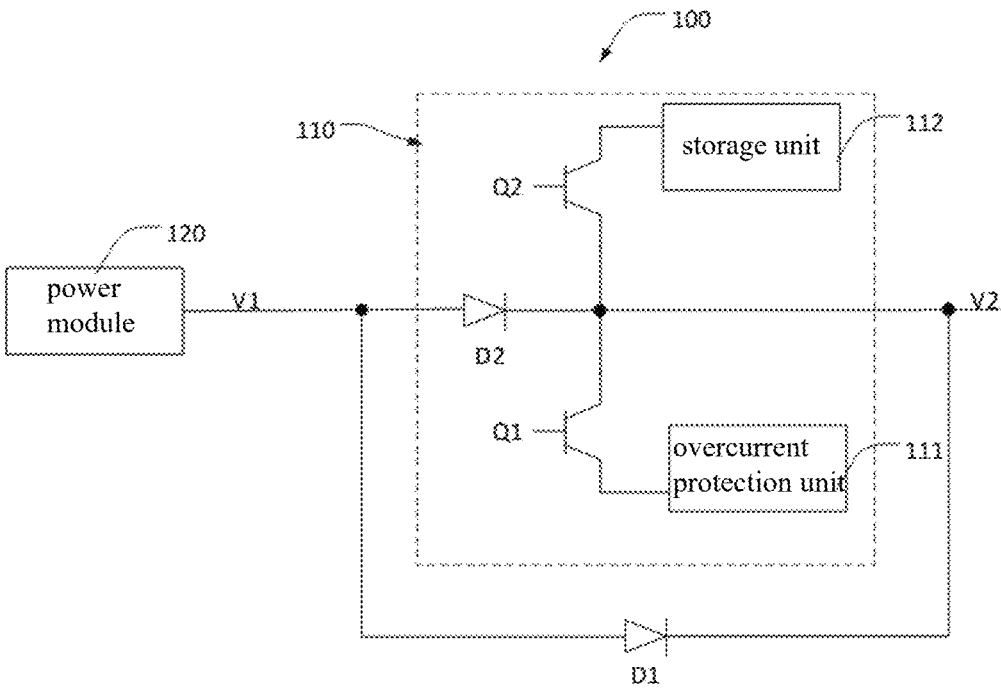
FIG. 2 is a specific connection diagram of a voltage conversion circuit according to an embodiment 1 of the present disclosure.

As shown in FIG. 2, the present disclosure provides a voltage conversion circuit 100 including a power module 120, a voltage conversion module 110, and a first diode D1.

The power module 120 is configured to output a first voltage signal V1. An input terminal of the voltage conversion module 110 is connected to the power module 120 for receiving the first voltage signal V1 and adjusting the first voltage signal V1 to output a second voltage signal V2. An output terminal of the voltage conversion module 110 is connected to a display panel, and the second voltage signal V2 is configured to drive the display panel to display.

A negative electrode of the first diode D1 is connected to the output terminal of the voltage conversion module 110, and a positive electrode of the first diode D1 is connected to the input terminal of the voltage conversion module 110.

The voltage conversion module 110 includes a first switching tube Q1, an overcurrent protection unit 111, and a second diode D2. A first terminal of the first switching tube Q1 is connected to the output terminal of the voltage conversion module 110. The overcurrent protection unit 111 is connected to the second terminal of the first switching tube Q1. The overcurrent protection unit 111 is configured to detect the voltage conversion module 110, trigger an overcurrent protection signal and send the overcurrent protection signal to the power module 120, and the power module 120 stops outputting the first voltage signal V1. A negative electrode of the second diode D2 is connected to the output terminal of the voltage conversion module 110 and the first terminal of the first switching tube Q1, and a positive electrode of the second diode D2 is connected to an input terminal of the power module 120.

In the present disclosure, the first diode D1 is connected in series between the output terminal and the input terminal of the voltage conversion module 110 (a normal conduction voltage drop is V1). When a voltage VDCHG at the output terminal of the voltage conversion module 110 is greater than or equal to a voltage VGL at the input terminal of the voltage conversion module 110, the first diode D1 is not turned on. When the voltage VDCHG at the output terminal is less than the voltage VGL at the input terminal of the voltage conversion module 110, the first diode D1 is turned on, so it can ensure that the VDCHG is greater than or equal to (VGL–V1), and it can solve a problem that the overcurrent protection signal is triggered by mistake.

A specific circuit connection of the voltage conversion circuit 100 of the present disclosure is introduced in an embodiment 1 as follows.

As shown in FIG. 2, the voltage conversion circuit 100 includes the power module 120 and the voltage conversion module 110.

The power module 120 is configured to output the first voltage signal V1. The input terminal of the voltage conversion module 110 is connected to the power module 120 for receiving the first voltage signal V1 and adjusting the first voltage signal V1 to output the second voltage signal V2. The output terminal of the voltage conversion module 110 is connected to the display panel. The second voltage signal V2 is configured to drive the display panel to display. The first voltage signal V1 includes a high voltage signal VGH or a low voltage signal.

The negative electrode of the first diode D1 is connected to the output terminal of the voltage conversion module 110, and the positive electrode of the first diode D1 is connected to the input terminal of the voltage conversion module 110. The first diode D1 is a Schottky diode.

The voltage conversion module 110 includes the first switching tube Q1, the overcurrent protection unit 111, a second switching tube Q2, and a storage unit 112.

The first terminal of the first switching tube Q1 is connected to the output terminal of the voltage conversion module 110. The overcurrent protection unit 111 is connected to the second terminal of the first switching tube Q1, and the overcurrent protection unit 111 is configured to detect the voltage conversion module 110, trigger the overcurrent protection signal and send the overcurrent protection signal to the power module 120, and the power module 120 turns off an output of the first voltage signal V1. The first switching tube Q1 is a parasitic NPN tube.

The negative electrode of the second diode D2 is connected to the output terminal of the voltage conversion module 110 and the first terminal of the first switching tube Q1. The positive electrode of the second diode D2 is connected to the input terminal of the power module 120.

A first terminal of the second switching tube Q2 is connected to the output terminal of the voltage conversion module 110, the first terminal of the first switching tube Q1, and the negative electrode of the second diode D2.

The storage unit 112 is connected to a second terminal of the second switching tube Q2. The first switching tube Q1 is the parasitic NPN tube.

In the embodiment 1, the first diode D1 is connected in series between the output terminal and the input terminal of the voltage conversion module 110 (the normal conduction voltage drop is V1). When the voltage VDCHG at the output terminal of the voltage conversion module 110 is greater than or equal to the voltage VGL at the input terminal of the voltage conversion module 110, the first diode D1 is not turned on. When the voltage VDCHG at the output terminal of the voltage conversion module 110 is less than the voltage VGL at the input terminal of the voltage conversion module 110, the first diode D1 is turned on to make the VDCHG greater than or equal to (VGL−V1), so it can ensure that VDCHG is greater than or equal to (VGL−0.3V), and it can solve the problem that the overcurrent protection signal is triggered by mistake.

Figure 3:
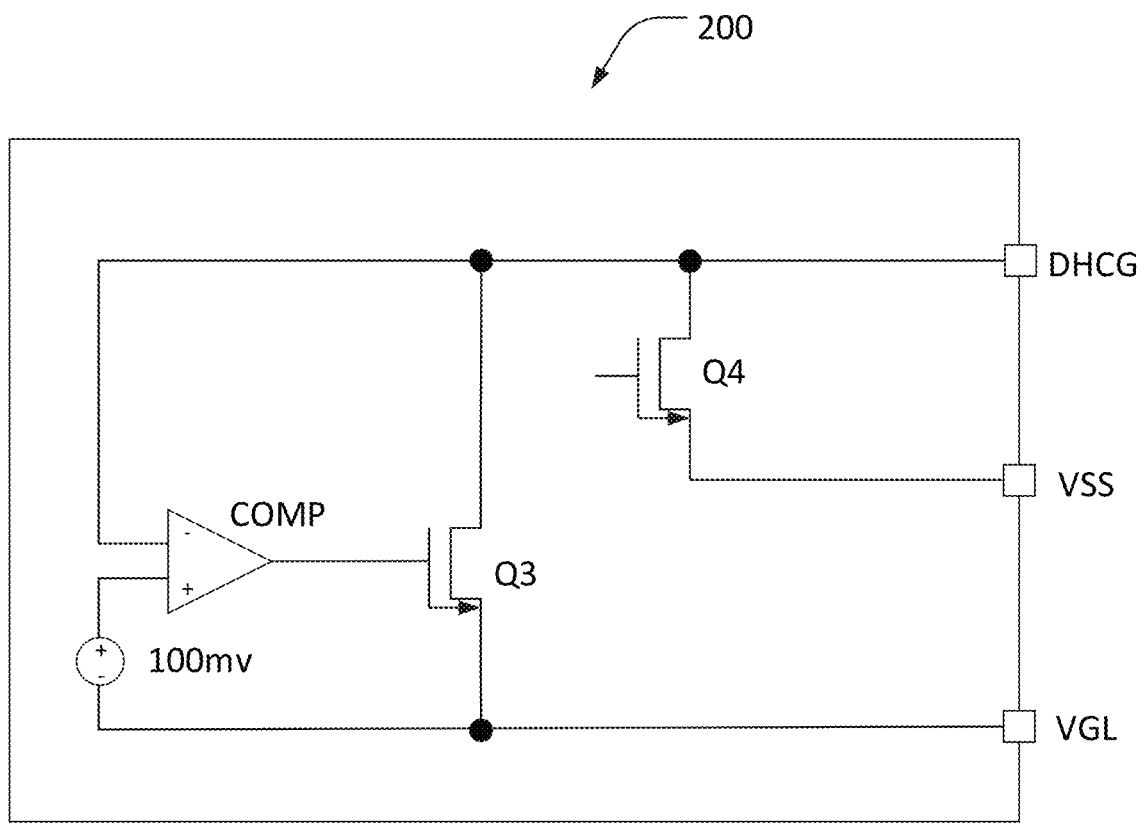
FIG. 3 is an internal connection diagram of a voltage conversion chip according to an embodiment 2 of the present disclosure.

As shown in FIG. 3, the embodiment 2 of the present disclosure provides a voltage conversion chip 200 to enhance a negative pressure capability. The voltage conversion chip 200 includes a multi-function configuration pin (not shown), a first power tube Q3, and a comparator COMP.

The multi-function configuration pin includes a first input pin VGL and a first output pin DHCG. A first terminal of the first power tube Q3 is connected to the first output pin DHCG, and a second terminal of the first power tube Q3 is connected to the first input pin VGL. A positive phase input terminal of the comparator COMP is connected to a first terminal of a constant voltage 100 mv, a negative phase input terminal of the comparator COMP is connected to the first terminal of the first power tube Q3 and the first output pin DHCG, and an output terminal of the comparator COMP is connected to a third terminal of the first power tube Q3.

A second terminal of the constant voltage is connected to the second terminal of the first power tube Q3 and the first input pin VGL.

In the embodiment 2, when an output current i1 of the first output pin DHCG is large, and the voltage VDCHG of the first output pin DHCG is less than the voltage VGL of the first input pin VGL +100 mv, the comparator COMP outputs a high voltage, the first power tube Q3 is turned on, and a negative voltage of the voltage VDCHG of the first output pin DHCG is determined by the output current i1 and an on-resistance RDSON of the first power tube Q3. If the on-resistance RDSON of the first power tube Q3 is 3Ω, the chip ensures that the output current i1 with the VDCHG greater than or equal to (VGL−0.3V) is 133 mA at the maximum, thus increasing a negative voltage ability of the first output pin DHCG.

Figure 4:
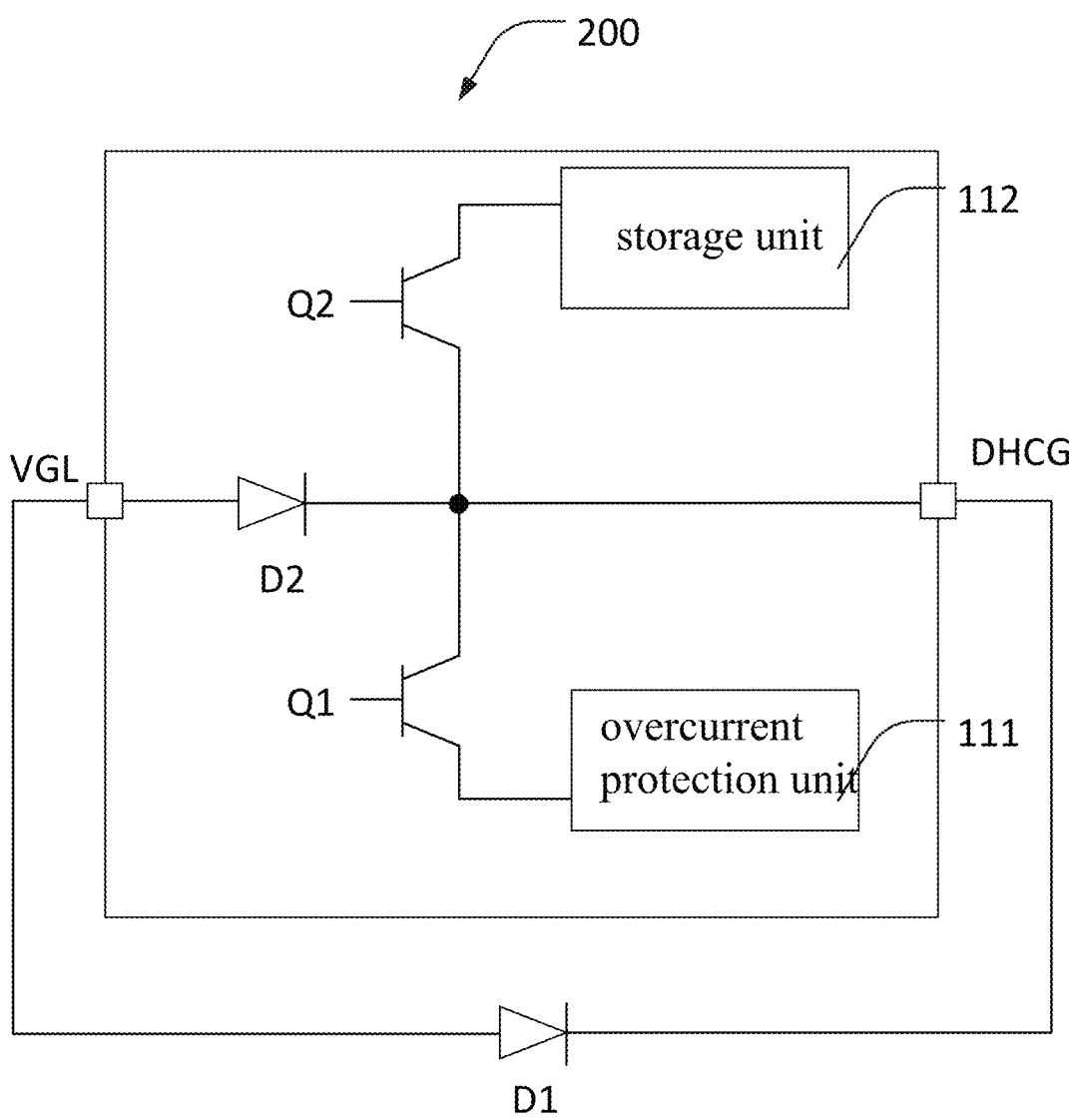
FIG. 4 is another internal connection diagram of the voltage conversion chip according to the embodiment 2 of the present disclosure.

As shown in FIG. 4, in the embodiment 2, the voltage conversion chip 200 further includes a second power tube Q4, the first switching tube Q1, the overcurrent protection unit 111, the first diode D1, the second diode D2, the second switch Q2, and the storage unit 112.

A first terminal of the second power tube Q4 is connected to the first output pin DHCG, and a second terminal of the second power tube Q4 is connected to the second input pin VSS of the voltage conversion chip 200. The first terminal of the first switching tube Q1 is connected to the first output pin DHCG. The overcurrent protection unit 111 is connected to the second terminal of the first switching tube Q1, and the overcurrent protection unit 111 is configured to detect the voltage conversion module 110, trigger the overcurrent protection signal and send the overcurrent protection signal to the power module 120, and the power module 120 stops outputting the first voltage signal V1. The negative electrode of the first diode D1 is connected to the first output pin DHCG, and the positive electrode of the first diode D1 is connected to the first input pin VGL. The first terminal of the second switching tube Q2 is connected to the first input pin VGL and the first output pin DHCG. The storage unit 112 is connected to the second terminal of the second switching tube Q2. The negative electrode of the second diode D2 is connected to the first terminal of the first switching tube Q1, the first terminal of the second switching tube Q2, and the first output pin DHCG, and the negative electrode of the second diode D2 is connected to the second output pin, the first terminal of the first switching tube Q1, and the first terminal of the second switching tube Q2. The positive electrode of the second diode D2 is connected to the first output pin DHCG. The first terminal of the second switching tube Q2 is connected to the first terminal of the first switching tube Q1 and the first output pin DHCG, respectively. The storage unit 112 is connected to the second terminal of the second switching tube Q2, and the first switching tube Q1 is the parasitic NPN tube.

In addition, in the embodiment 2, the first diode D1 of the voltage conversion chip 200 is connected in series between the first output pin DHCG and the first input pin VGL (the normal conduction voltage drop is V1). When the voltage VDCHG at the output terminal of the voltage conversion module 110 is greater than or equal to the voltage VGL at the input terminal of the voltage conversion module 110, the first diode D1 is not turned on. When the voltage VDCHG at the output terminal of the voltage conversion module 110 is less than the voltage VGL at the input terminal of the voltage conversion module 110, the first diode D1 is turned on to make the VDCHG greater than or equal to (VGL−V1), so it can ensure that VDCHG is greater than or equal to (VGL−0.3V), and it can solve the problem the overcurrent protection signal is triggered by mistake.

The voltage conversion circuit 100 provided by the embodiment of the present disclosure has been described in detail above. Specific examples are used in the disclosure to illustrate the principle and implementation of the present disclosure. The description of the above embodiments is only configured to help understand the method and the core idea of the present disclosure. At the same time, for those skilled in the art, according to the idea of the present disclosure, there will be changes in the specific implementation and the scope of application. In summary, the content of the specification should not be construed as a limit to the present disclosure.

What is claimed is:

1. A voltage conversion circuit, comprising:
a power module, configured to output a first voltage signal;
a voltage conversion module, wherein an input terminal of the voltage conversion module is connected to the power module to receive the first voltage signal, and is configured to amplify and reduce the first voltage signal to output a second a voltage signal; and
a first diode, wherein a negative electrode of the first diode is connected to an output terminal of the voltage conversion module, and a positive electrode of the first diode is connected to the input terminal of the voltage conversion module;
wherein the voltage conversion module comprises:
a first switching tube, wherein a first terminal of the first switching tube is connected to the output terminal of the voltage conversion module;

an overcurrent protection unit, wherein the overcurrent protection unit is connected to a second terminal of the first switching tube, and the overcurrent protection unit is configured to trigger an overcurrent protection signal and send the overcurrent protection signal to the power module to make the power module stop outputting the first voltage signal; and
a second diode, wherein a negative electrode of the second diode is connected to the output terminal of the voltage conversion module and the first terminal of the first switching tube, and a positive electrode of the second diode is connected to an output terminal of the power module,
wherein the voltage conversion module further comprises:
a second switching tube, wherein a first terminal of the second switching tube is connected to the output terminal of the voltage conversion module, the first terminal of the first switching tube, and the negative electrode of the second diode; and
a storage unit, wherein the storage unit is connected to a second terminal of the second switching tube.

2. The voltage conversion circuit as claimed in claim 1, wherein the first diode is a Schottky diode.

3. The voltage conversion circuit as claimed in claim 1, wherein the first switching tube is a parasitic NPN tube.

4. The voltage conversion circuit as claimed in claim 1, wherein the first voltage signal comprises a high voltage signal or a low voltage signal.

5. The voltage conversion circuit as claimed in claim 1, wherein the second switching tube is a parasitic NPN tube.

* * * * *